United States Patent
Gach et al.

(10) Patent No.: US 9,577,443 B2
(45) Date of Patent: Feb. 21, 2017

(54) BATTERY SYSTEM AND MANAGEMENT METHOD

(71) Applicants: Eric Gach, Mount Prospect, IL (US); William Fechalos, Naperville, IL (US); N. William Conrardy, Elmhurst, IL (US)

(72) Inventors: Eric Gach, Mount Prospect, IL (US); William Fechalos, Naperville, IL (US); N. William Conrardy, Elmhurst, IL (US)

(73) Assignee: C&C Power, Inc., Carol Stream, IL (US)

( * ) Notice: Subject to any disclaimer, the term of this patent is extended or adjusted under 35 U.S.C. 154(b) by 995 days.

(21) Appl. No.: 13/775,753

(22) Filed: Feb. 25, 2013

(65) Prior Publication Data
US 2014/0239964 A1    Aug. 28, 2014

(51) Int. Cl.
*H02J 7/04*    (2006.01)
*H02J 7/06*    (2006.01)
*H02J 7/00*    (2006.01)

(52) U.S. Cl.
CPC ............ *H02J 7/0021* (2013.01); *H02J 7/0016* (2013.01); *H02J 7/0029* (2013.01); *H02J 2007/0037* (2013.01)

(58) Field of Classification Search
CPC .................................................. H02J 7/0021
USPC .... 320/132, 152, 157–159, 162–164; 702/63
See application file for complete search history.

(56) References Cited

U.S. PATENT DOCUMENTS

| | | | |
|---|---|---|---|
| 5,223,796 A | 6/1993 | Waldman et al. | |
| 5,281,955 A | 1/1994 | Reich et al. | |
| 5,680,031 A * | 10/1997 | Pavlovic | H02J 7/0093 320/145 |
| 5,703,465 A | 12/1997 | Kinoshita et al. | |
| 5,705,929 A * | 1/1998 | Caravello | G01R 31/3631 324/430 |
| 6,268,710 B1 | 7/2001 | Koga | |
| 6,532,425 B1 | 3/2003 | Boost et al. | |
| 7,183,747 B2 | 2/2007 | Kleineberg et al. | |
| 7,474,228 B2 | 1/2009 | Lockhart et al. | |
| 8,421,639 B2 * | 4/2013 | Bitsch | G01R 19/16547 340/660 |

(Continued)

OTHER PUBLICATIONS

The Nov. 12, 2010 Response to the Office Action dated Jun. 4, 2010 from the Canadian Intellectual Property Office for Canadian Patent Application No. 2,634,309, 13 pages.

(Continued)

*Primary Examiner* — Richard V Muralidar
(74) *Attorney, Agent, or Firm* — Brinks Gilson & Lione (57) ABSTRACT

A system and method for monitoring the status of a system of battery strings is described. The battery string current is measured by a current sensor urged into contact with a metallic element in which the battery string current is flowing. The time history of the battery string current and voltage is interpreted to determine whether the battery string is discharging, charging or in a fully charged state. A moving average current in the charging state is used to establish a threshold for determining whether a thermal runaway condition exists. The moving average is maintained at the value that existed at a time when the battery string has been disconnected from the system current bus.

31 Claims, 7 Drawing Sheets

(56) References Cited

U.S. PATENT DOCUMENTS

| | | | |
|---|---|---|---|
| 8,558,508 B2* | 10/2013 | Fechalos | G01R 31/3606 |
| | | | 320/132 |
| 8,558,712 B2* | 10/2013 | Fechalos | H01M 10/482 |
| | | | 320/116 |
| 2001/0033502 A1 | 10/2001 | Blair et al. | |
| 2002/0075941 A1 | 6/2002 | Souissi et al. | |
| 2002/0145405 A1 | 10/2002 | Murakami et al. | |
| 2003/0038612 A1 | 2/2003 | Kutkut | |
| 2006/0017444 A1 | 1/2006 | Fechalos et al. | |
| 2008/0218125 A1 | 9/2008 | Bansal et al. | |

OTHER PUBLICATIONS

The Office Action dated Jun. 4, 2010 from the Canadian Intellectual Property Office for Canadian Patent Application No. 2,634,309, 3 pages.

* cited by examiner

BATTERY SYSTEM AND MANAGEMENT METHOD

TECHNICAL FIELD

This application may have relevance to battery systems and the monitoring of the status of rechargeable batteries as used in power supply systems. More particularly, the system and method may be sued to determine whether a battery system is in a thermal runaway condition.

BACKGROUND

Direct current (DC) power is needed for many types of telephone communication equipment, for control equipment used at electric utility substations, for computer data centers, and power plants, and other similar uses. The DC power may be supplied by a DC power source which may be supplied with AC power from an AC power source, such as the local power grid, or a generator and prime mover. Standby batteries are utilized as a backup DC power source when the DC power source either cannot supply all the power required by the components or when the AC power supply or other external power source is not available, as during a power failure at the local electric utility, or in the power distribution system. The period of time where such battery backup is required may be reduced by providing local diesel-electric or turbine-powered electric generators. However, during the time where other backup power sources are unavailable or when switching between alternative prime power sources, standby batteries are needed. Since the occurrence of power outages is normally infrequent, the condition of the batteries during the times when they are not actively providing the backup power may not be known.

A storage battery has an internal impedance, which includes resistive, inductive and capacitive components. When the battery is discharging, only DC is involved and the resistive component of the impedance is of interest as the discharge current produces a voltage drop across the internal resistance of the battery in accordance with Ohm's law. Over the life of the battery the internal resistance will increase, at a rate determined by such factors as how many times the battery undergoes cycles of discharging and recharging, and other factors. The internal resistance of any cell will eventually increase to a value where the voltage drop across the effective internal resistance during discharge is so great that the battery can no longer deliver power at its rated capacity. Other defects in the battery, or aging of the battery, may also result in degradation of the capacity of a battery to perform its function.

When strings of batteries are used to increase the voltage being supplied or, in general, when batteries are connected in either series or parallel, the impedance of the overall string has an influence on the amount of energy that can be supplied. Other components of the physical assembly, including connecting links, terminal connections and the like which can exhibit resistance, and whose characteristics may vary with time, due to such factors as corrosion and changes in contact pressure, also contribute to the resultant battery status.

There are a variety of battery monitoring systems available. Typically these battery monitoring systems are configured so as to monitor each of the individual batteries in a battery string. Other monitors are configured so as to monitor individual battery terminal voltages as a means of identifying defective batteries. Such monitoring systems require a direct connection to each of the batteries in the string for proper functioning.

The 2009 edition of the International Fire Code (available from the International Codes Council, Washington, D.C.), at section 608.3, requires that valve regulated lead-acid (VLRA) and lithium ion batteries be provided with a listed device or other approved method to preclude, detect and control thermal runaway. The requirements of this code are being adopted by local, state and national authorities.

SUMMARY

A battery system and system for monitoring the performance of a battery system is described, including a current sensor communicating with a controller, and a status display. The current sensor is disposed so as to measure the battery current in a battery string, and provides for the detection of a thermal runaway state and the isolation of the battery string exhibiting the thermal runaway state from the remainder of the battery system.

In an aspect, battery backup system is disclosed including a current sensor, disposed so as to measure a current value of a battery string; a controller; and a switch disposed in a series connection with the battery string. The controller is configured to compare the measured battery string current value with threshold current value to determine whether the battery string has encountered a thermal runaway condition.

In yet another aspect, a method of protecting a battery system, includes the steps of: measuring a current value of a battery string; determining an operating state of the battery string using at least the measured current value; comparing the measured current value of the battery string with a threshold current value to determine whether the battery string has encountered a thermal runaway condition.

In still another aspect, a software program product, stored on a computer-readable medium is disclosed, the software program product enabling a computer to perform the steps in a method, including: accepting a current value measurement for a battery string in a battery system; determining whether a battery in the battery string has encountered a thermal runaway condition; and commanding a switch device to isolate the battery string from the remainder of the battery system.

A current sensor is disclosed, comprising a pair of probes urged against a conductor, the probes aligned substantially along a direction of current flow; a high impedance amplifier and a floating power supply.

DETAILED DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Embodiments of this invention may be implemented in hardware, firmware, software, or any combination thereof, and may include instructions stored on a machine-readable medium, which may be read and executed by one or more processors. In an aspect where a computer or a digital circuit is used, signals may be converted from analog format to a digital representation thereof in an analog-to-digital (A/D) converter, as is known in the art. The choice of location of the A/D conversion will depend on the specific system design.

The instructions for implementing process measurement, data analysis and communications processes may be provided on computer-readable storage media. Such storage media may be memories such as a cache, buffer, RAM, FLASH, removable media, hard drive or other computer readable storage media. The functions, acts or tasks illustrated in the figures or described herein may be performed in response to one or more sets of instructions stored in or on computer readable storage media. The functions, acts or tasks are independent of the particular type of instruction set, storage media, processor or processing strategy and may be performed by software, hardware, integrated circuits, firmware, micro code and the like, operating alone or in combination. The instructions may be stored on a removable media device for distribution to, or for reading by, local or remote systems. In other embodiments, the instructions may be stored in a remote location for transfer through a computer network, a local or wide area network, the Internet, or over telephone lines. In yet other embodiments, the instructions are stored within a computer or system.

Figure 1:
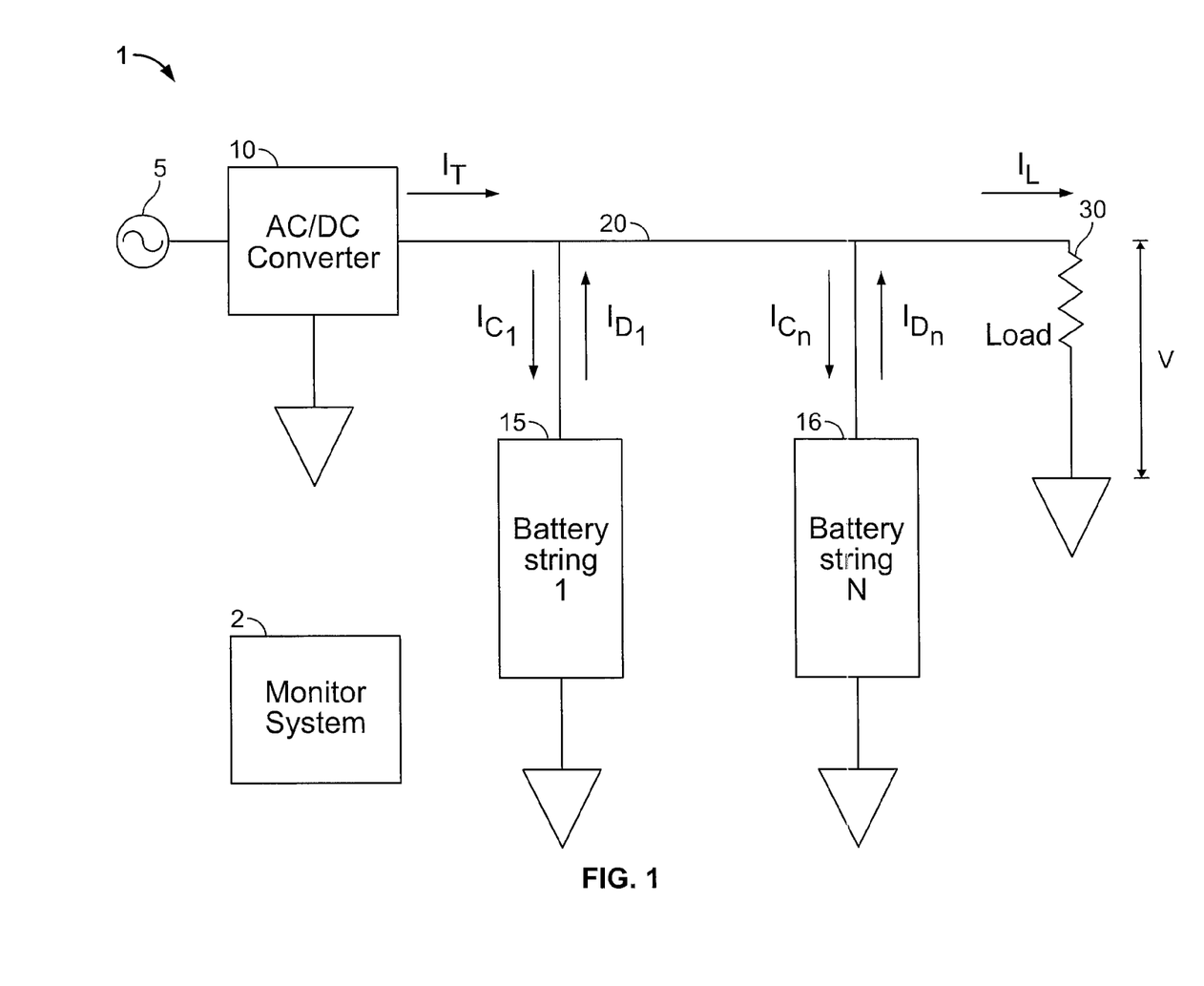
FIG. 1 is a block diagram of a battery backup system.

A battery system may consist of two or more batteries, the batteries configured in a series string, and connected to an electrical load for providing power to the load, and to a charging or recharging device so as to replenish the charge of the batteries when the batteries have been used as a temporary source of power. An example of such a configuration is shown in FIG. 1, where several strings are shown arranged in parallel. The AC/DC converter 10 is connected to a source of electrical power 5, which may be a conventional AC power distribution grid, or a local generator. The input source of power may be switchable between two or more sources (not shown) so that a failure of one source may not interrupt the power supply for an extended period of time. During the time need to switch between alternative power supplies, and which may include the starting time for a generator backup power supply, such as a diesel-electric generator, another distribution grid feeder line, or the like, the battery strings 15, 16 provide DC current to the load 30.

The term load is understood to mean the power requirements of the equipment using the DC power, and may include computing equipment, telephone switching equipment, or the like, or an inverter to convert the DC power to AC power for equipment requiring the same. When there is not a source of back-up primary power, the battery strings may have a larger capacity so as to permit a longer period of primary power outage before the stored energy in the batteries is effectively exhausted.

As described in U.S. patent application Ser. No. 12/117, 462, filed on May 8, 2008, the batteries may be continuously connected to the load such that, when the DC power supply voltage decreases below the battery string terminal voltage, the batteries supply power, as needed, to the load without interruption. Other configurations are possible, depending on system power continuity requirements.

The voltage V applied to the load 30 depends on the requirements of the specific equipment being powered, and may typically range from about 24 VDC to about 480 VDC, although both higher and lower voltages can be used. A plurality of rechargeable storage batteries may be connected in series to result in the design voltage. Storage batteries, such as lead-acid technology batteries, often are configured to have a terminal voltage of 12.6 VDC, and a plurality of batteries may be connected in series to obtain the design voltage if the voltage is greater than that of a single battery. (Herein, an individual battery terminal voltage of 12 VDC is used in the description as an approximation, for convenience.) Thus, a supply voltage of 24 volts DC is provided by connecting in series two battery modules each having a terminal voltage of 12 volts DC. The energy capacity of the storage batteries may be expressed in ampere-hours (AH) and is a measure of the time-to-discharge of a battery supplying a known current. Generally, however, storage batteries are not fully discharged in operation.

The current requirements of the load may exceed that which may be supplied by a single string of storage batteries, and thus a first storage battery string 15, and additional battery strings 16, each string comprised of a plurality of storage batteries connected in series, are then connected in parallel.

The description herein may use lead-acid technology storage batteries as examples; however nothing herein is intended to limit the use of the system and method to any particular battery type, such as VRLA.

A first state exists where the primary power is present and the AC/DC converter 10 supplies both the load current $I_L$ and the float current $I_{F1}, \ldots I_{Fn}$ of the individual battery strings 1, . . . , n. The load current $I_L$ is the current supplied at a voltage V such that the electrical power requirements of the system defined as the "load" may be satisfied. The "load" may be represented as a nominally resistive element 30 (with respect to the DC aspects of the power requirements), as in FIG. 1. Float currents $I_F$ may be currents flowing into the battery strings 15, 16 when the batteries are considered to be in a substantially fully charged state.

When the primary power is not present, a second state occurs where the output current of the AC/DC converter 10 is effectively zero, and the current requirements of the load, $I_L$, are supplied from the battery strings 15, 16. After a discharge period, when the primary power has been restored, in a third state, the AC/DC converter 10 supplies the load current $I_L$ as well as charging currents $I_{C1}, \ldots I_{Cn}$ to the battery strings 15,16. The charging currents $I_{Cn}$ decrease with time as the storage batteries are recharged, so that, after a period of time, the charging currents $I_{Cn}$ become small, and approach a value of float current $I_{Fn}$.

The quality state of the batteries in a battery string may be determined, as a poor quality or failed battery in a string may prevent the batteries of the battery strings from delivering the expected current to the load during the second (discharging) state, or from achieving the duration of performance expected. A poor quality or defective battery may increase the current required to be delivered by the remaining battery strings, which may exceed the capacity of the remaining strings, and the increased rate of discharge results in a shorter duration of availability of back-up power, a longer charging time, and may adversely affect the lifetime of the batteries.

Each of the batteries in the battery strings may be expected to have substantially the same capacity, internal resistance, operating temperature, and other characteristics, such as terminal voltage and float current, at least when originally installed and functioning properly.

Where measured currents are described, including average measured currents, the short-term measurement value is meant. That is, the measured current may change with time on a same scale associated with the operation of the system in various states and, within a state, on a time scale that is long compared with sources or noise and ripple. Some technique such as averaging, filtering, simultaneous sampling, or the like, may therefore be used to reduce the effects of noise, or the pick up of alternating currents or ripple.

In the second state, where the battery is being discharged: $I=I_D$ where $I_D$ is the string discharge current. Similarly, in the first state where the battery is being charged, $I=I_C$ In state three, where the batteries are fully charged, the current in a battery string is $I_F$. The sign of the currents in the first state and the second state is the same but of substantially different value. The sign of the current in the discharge state is opposite to the other state and generally much larger in magnitude than the other two values.

A normal float current $I_F$ is a small percentage of the battery ampere-hour rating, may differ from battery-technology-to-battery-technology, and may be about 0.001 times the ampere-hour rating for lead-acid storage batteries. Similarly to the current values in the first and second states, a percentage threshold may be established for warning and alarm conditions of the float current $I_F$.

If multiple failures of the primary power supply occur prior to the occurrence of the fully charged state, the charging time may be extended proportionally to the additional discharge time periods.

In another aspect, the amount of energy discharged from the battery during a discharge cycle may be computed by measuring the current during the discharge cycle and a re-charging time estimated based on the discharge time and current and an efficiency factor in recharging.

For example: Re-charging_time (hrs)=(discharge_time (hrs)×discharge_current)/(K×charging_current), where K is an efficiency estimate for the recharging process, and is approximately 0.85 for many types of lead-acid batteries. Where a second discharging cycle is entered prior to completion of the recharging cycle, the time remaining may be determined by adding the additional recharging time associated with the additional the discharge periods to the remainder of the previous recharging time.

The discharging current $I_D$ may be relatively constant during the discharge period $T_D$; however, the charging current $I_C$ is a function of time during the charging period $T_C$, varying from a high value at the beginning of the charging period and declining to approximately $I_F$ at the end of the charging period, when the battery system enters the float state. Depending on the accuracy to which $T_C$ is desired to be estimated, either a fixed time profile may be used, or the actual charging current $I_C(t)$ may be integrated so as to obtain a continuous estimate of the time to complete the charging.

Determining whether the battery string is in a charging state or in a fully charged (float) state may be useful in monitoring the battery string so as to detect thermal runaway situations. Such situations may be categorized as "thermal walkaway" or "thermal runaway", depending on the rapidity of the process. The variety of conditions of temperature, battery age, cell failure and the like that may cause a runaway condition nevertheless result in several characteristic time-dependent current profiles, when measured at the input to a battery string.

Where a thermal runaway or a thermal walkaway condition is encountered, the affected battery string should be isolated from the remainder of the battery backup system in accordance with a specific procedure. Permitting the continued charging of a battery string may result in catastrophic failure of the battery with concomitant potential for damage to the remaining components of the system and hazards to personnel. This is the motivation for the requirements to monitor battery systems for this mode of failure and to have a capability to automatically isolate the battery or battery string exhibiting the runaway condition. Unless the context makes it clear that a "runaway" condition has a different character than a "walkaway" condition, the term thermal runaway is considered to encompass both syndromes.

Thus, in each of the operating states of the battery system, the current may be monitored to determine that the battery string current has a measured value within pre-established limits. The measurement of the float current $I_F$ represents a normal operating state where the primary power is being supplied to the AC/DC power supply and the batteries are in a fully charged state. In most uses, the fully-charged (float) condition is the predominant operating state.

The current flowing into or out of a battery string 15 may be measured by a current sensor, which has the function of an ammeter, and which may be connected at any point in the series connection of the batteries comprising the string.

Figure 2:
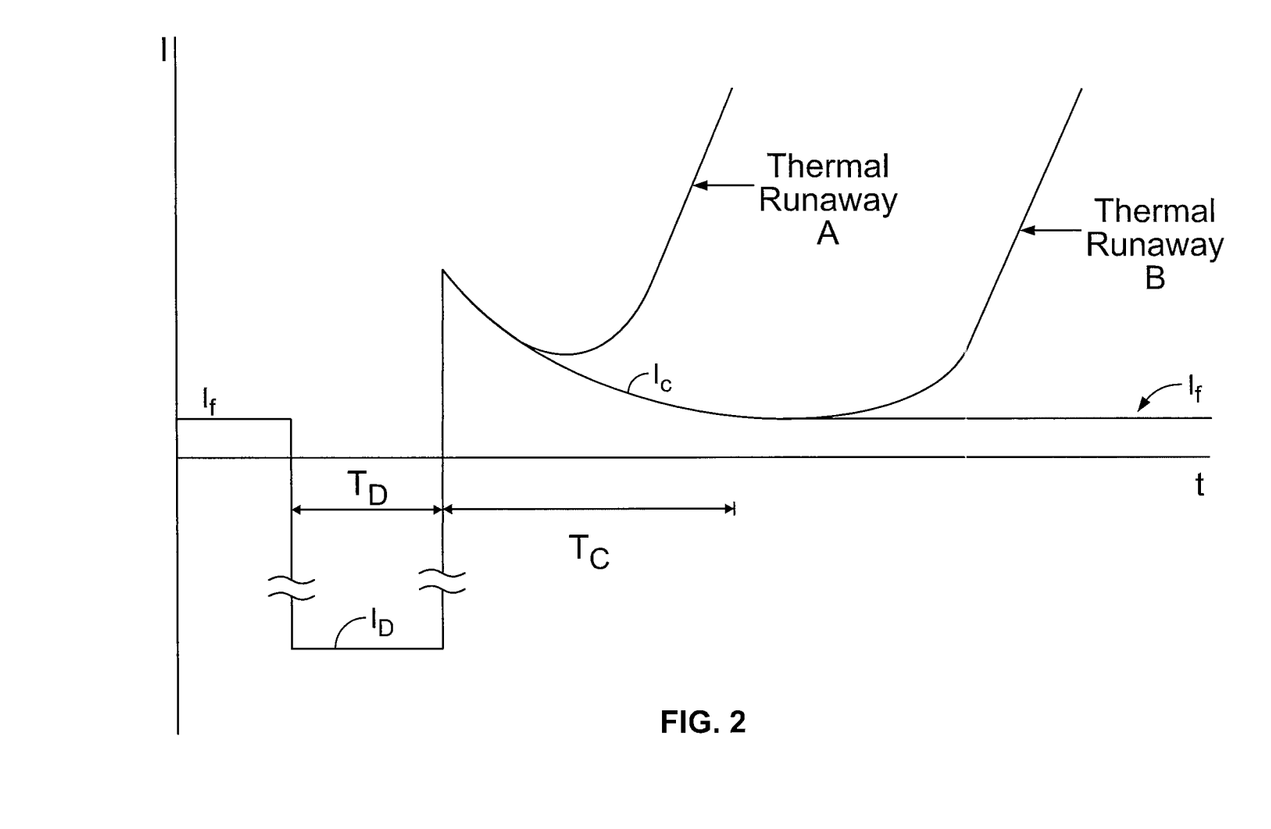
FIG. 2 is a conceptual representation of a time history of a discharging event and subsequent recharging of the batteries, where several types of thermal runaway are also shown.

FIG. 2 is illustrative of the current profiles related to a backup battery discharge event. Such events occur, as previously described, when the source of power, such as the commercial power electrical grid, encounters a failure. The discharge event may end when the power grid failure is rectified; however, more typically a backup generator located at the site of the battery backup system 1 is engaged after a short delay and provides a source of power until the grid fault is rectified.

The most common state of the system 1 is a fully charged (float) state, as the electrical grid is highly reliable. When in the fully charged state, the measured current flowing into a battery string would be expected to be the float current $I_F$. At the time of the power outage, the AC/DC converter 10 is no longer provided with a source of power 5, and the current requirements of the load 30 need to be provided by the battery string 15. The total of the currents provided by the battery strings of a battery system would be equal to the total current requirements of the load 30, which were previously provided by the AC/DC converter 10.

A current $I_D$, contributing to the total load current $I_L$ flows out of each of the battery strings during a discharge event, and this current $I_D$ is measured by a current sensor associated with each battery string. During the discharge period, which may have a duration $T_D$, the discharge current $I_D$ may be relatively constant as the required load current $I_L$ may be relatively constant. In this circumstance, the energy supplied by the battery is proportional to $T_D I_D$, as the battery terminal voltage is also substantially constant. Where the required load current $I_L$ is expected to be variable, the energy expended in the discharge may be computed by integrating the actual value discharge current and the voltage at the battery string terminals over the discharge period.

Once the source of power 5 is restored, the current requirements of the load are supplied from the AC/DC converter 10, which may also provide a source of current for recharging the batteries. Typically, the charging current $I_C$ is largest at the commencement of the recharging cycle, and monotonically decreases with time so as to become asymptotic to the float current $I_F$. As previously described, the time to reach this fully charged state may be estimated based on the amount of energy that the battery has supplied to the load during the discharge period, and a characteristic efficiency factor to account for inefficiencies in the process. The energy expended has been previously determined during the discharge period. The amount of energy being supplied to the battery string during the charging period determines the estimated recharging time. Assuming that the charging current were represented by a constant current $I_{Cave}$, the estimated charging time $T_C = (I_D T_D / K \, I_{Cave})$, where K is the efficiency. $I_{Cave}$ may be estimated from the peak charging current and an experiential factor determined for a particular battery type, or may continually be re-estimated by integrating the measured time varying charging current $I_C$ (t).

However $T_C$ is estimated, the battery current should be essentially the float current $I_F$ at a time $T_C$ after commencing of recharging of the batteries. Should this situation not obtain, one may presume that a thermal runaway condition, such as that shown as trace A in FIG. 2 has occurred. The expiry of the expected charging time $T_C$ without a thermal runaway condition being encountered is the normal condition. However, should a thermal runaway condition be encountered during the recharging of the battery string, the runaway condition may also be detected prior to the conclusion of the charging state.

A characteristic of a thermal runaway condition during the charging period is that the value of the charging current, which was expected to decline monotonically in value with increasing time, until the charging current became equal to the float current, has not continued that trend. Rather, the slope of the current time history becomes zero and reverses sign so that the current tends to increase rather than decrease. Monitoring the charging current so as to detect such an occurrence in a battery string provides for the identification of a potential thermal runaway condition prior to the completion of the expected charging time. That is, should the charging current in a particular battery string increase, rather than decrease, a thermal runaway condition may be occurring.

Depending on the wear state of the batteries, or the nature of the failure of a cell of a battery, a condition of thermal walkaway, such as that shown as trace B in FIG. 2 may occur during the fully charged or float state. In this circumstance, the battery string has returned to the fully charged state, or may have been in a fully charged state for an extended period of time prior to the walkaway event. A steady rise of the current above the expected float current $I_F$ may be used to identify this type of condition. Depending of the specific circumstances, the current may increase ever more rapidly as the event progresses, so as to have characteristics similar to a thermal runaway event occurring during the charging period. This should be recognized by the monitoring system as the rate of increase of current and the heat produced could result in catastrophic damage.

Figure 3:
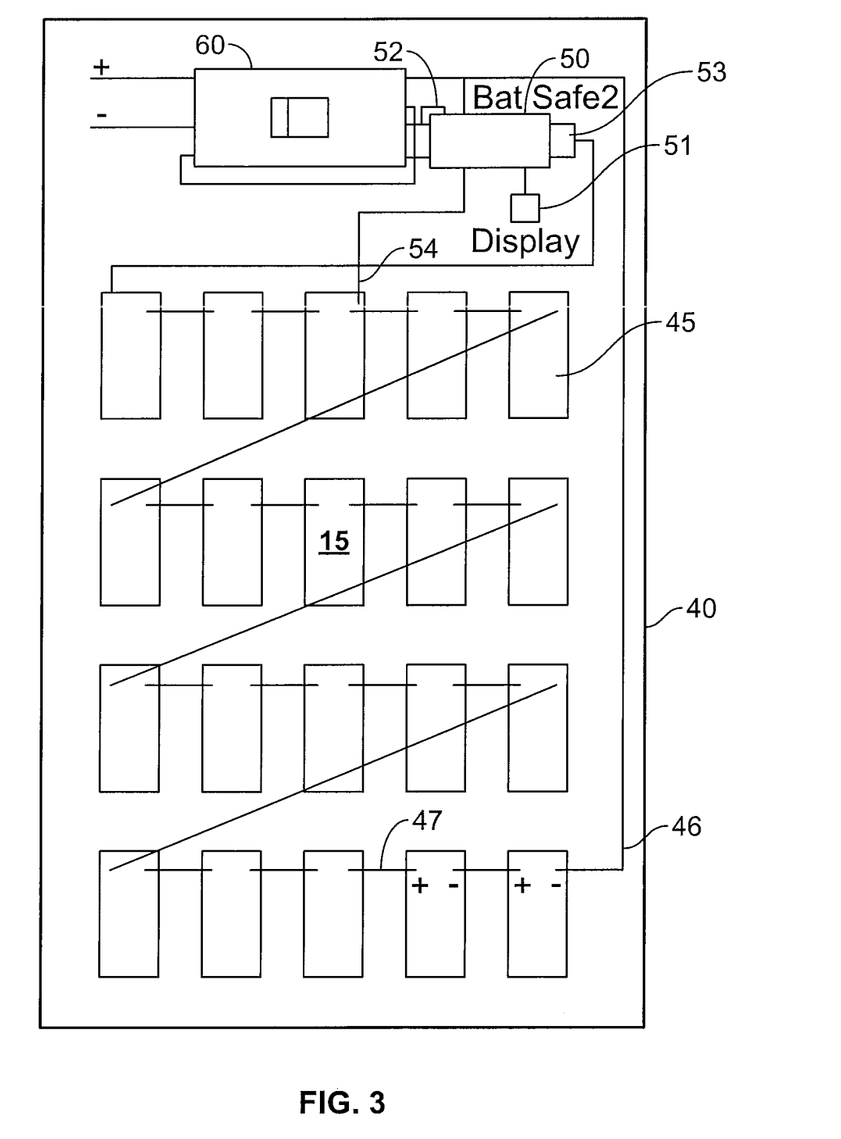
FIG. 3 shows an elevation view of a battery cabinet having a plurality of storage batteries arranged in a string and having a monitoring and protection circuit.

A configuration of a battery string 15 with a thermal runaway monitor 50 is shown in FIG. 3 in a cabinet 40. In this example, the batteries 45 are mounted on shelves in the cabinet and connected in series by a plurality of cables 46, jumpers 47, and the like so as to yield a voltage at the output terminals that is the sum of the output voltages of the individual batteries 45. In this example, if the individual batteries have a terminal voltage of 12 VDC (nominal), the voltage output of the string 15 is 240 VDC (nominal). A battery runaway monitor 50, which may have an associated display 51 or an audible alarm, and may be mounted to a portion of the electrical circuit 53, which may be a cable or a bus bar. The output of the battery string 15 may be routed through a circuit breaker or disconnect switch 60, which may be configured to trip at a specified maximum current, actuated by an auxiliary circuit, or manually.

In an example, the battery runaway monitor is powered by connecting the input to the power supply of the device to two places in the series battery string. Here, the connections are made by wires 52 and 54 so that the voltage across the power supply terminals is determined by the last 3 batteries in the string. With 12 VDC batteries, this would result in a 36 VDC supply voltage. As the power consumed by the battery monitor 50 is rather nominal, this additional load does not affect the performance of the battery string, although in long term storage of the battery system the connection might be interrupted to prevent battery drain. Alternatively, the power supply input may be connected across the output of the entire string. In another alternative, the a first terminal of the power supply may be connected to the lowest voltage point (with respect to chassis ground) in the system and a second terminal connected to a relatively low voltage location may be useful in reducing voltage stress on the components.

Figure 4:
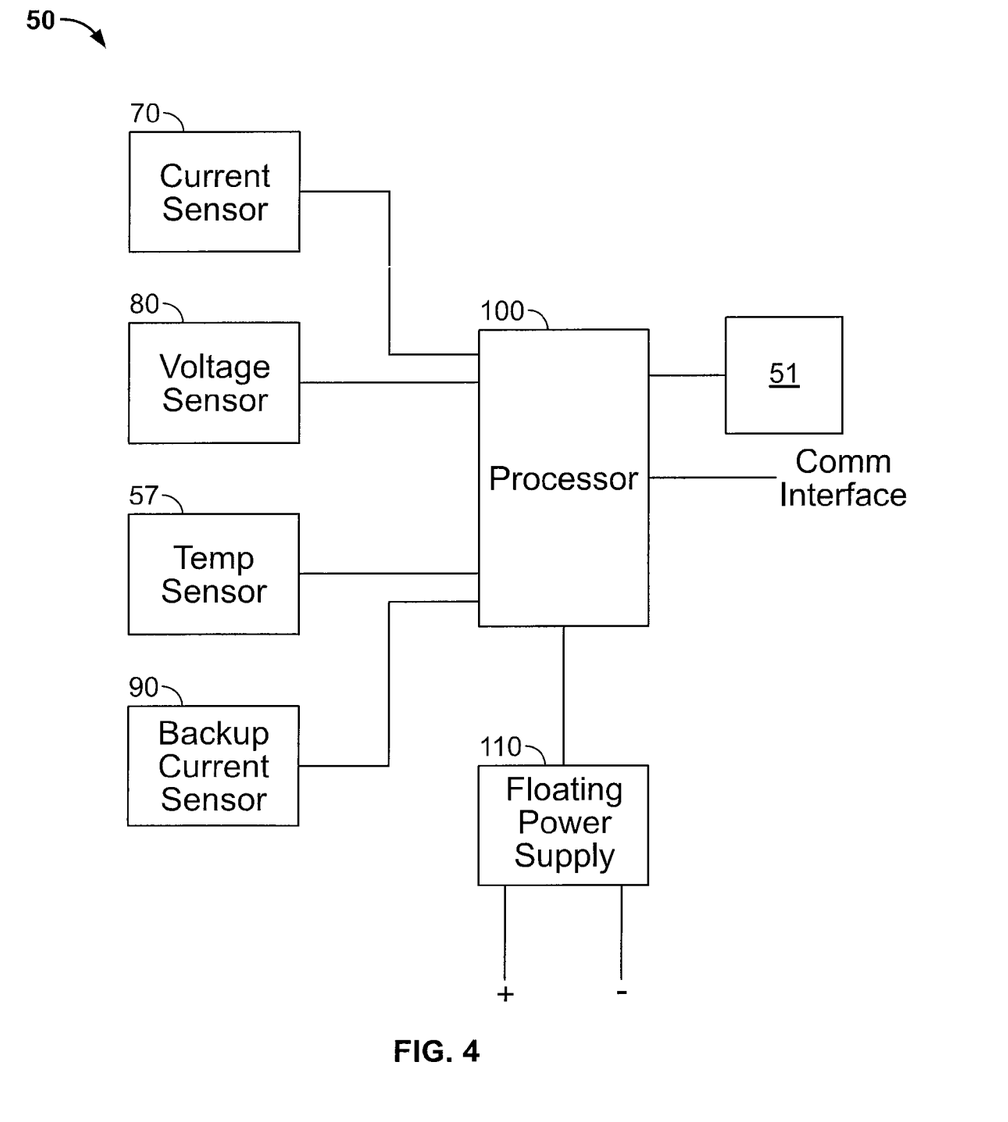
FIG. 4 is a block diagram of the runaway monitor unit.

FIG. 4 is a block diagram of the battery runaway monitor 50. A current sensor 70, a voltage sensor, a temperature sensor 57 and a backup current sensor 90 provide inputs to a microprocessor 100 which executes a stored program to perform the data acquisition and processing needed to effect the protection of the battery string 15. A display 51, or annunciator, may be provided so as to visually show the proper operation of the protective device and to call attention to a runaway or other abnormal condition. Although not shown in detail, a communications interface may be provided so as to enable remote monitoring of the battery fault monitor, the loading of program and parameter updates and the like. A lightwave interface may be used to provide voltage and noise isolation.

A temperature sensor 57 may be provided in contact with the current sensing element, while other temperature sensors may be used to monitor the temperature of one or more batteries or the ambient environment. Two temperature sensors 57 may be used, positioned on either side of the monitor 50 so as to determine an average temperature of the bar 53 or a cable between the probes 56 in a situation where the thermal environment differs between the two contact points due to end conditions of the bar 53, for example. The voltage output of the battery string 15 may be measured by the voltage sensor 89, which may be an analog-to-digital (A/D) converter operating in conjunction with a high resistance voltage divider (not shown). A backup current sensor 90 may be provided and be of a different type than the primary current sensor 70.

Figure 5A:
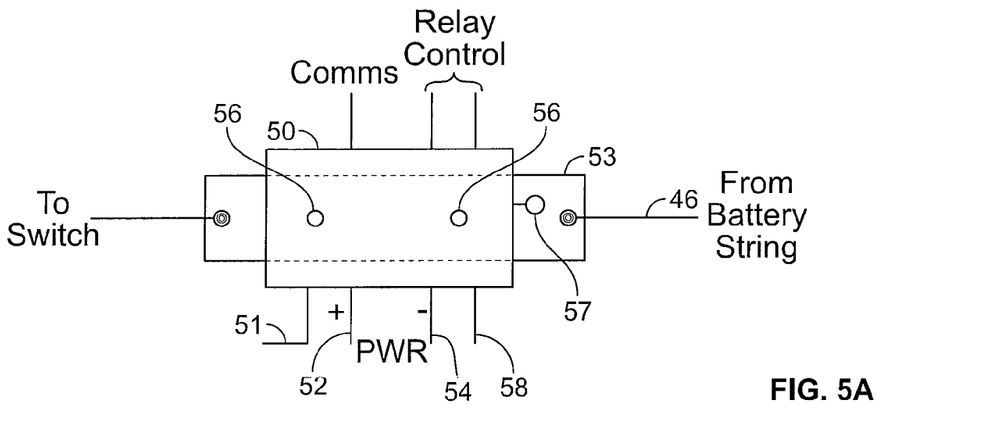
FIG. 5A is a top view and 5B is a side view of the runaway monitor unit as mounted to a bus bar.
Figure 5B:
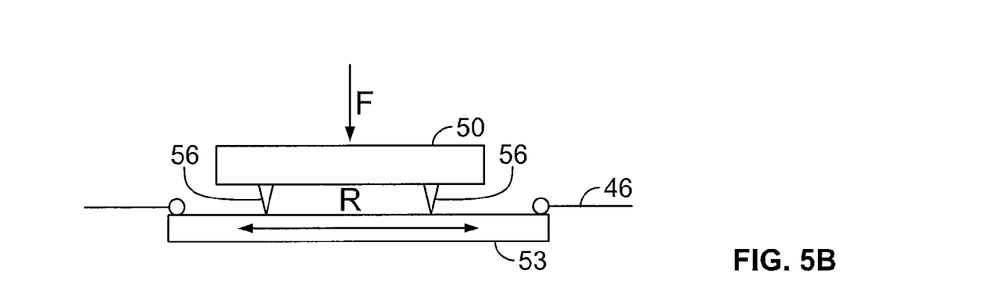

In an aspect, the current sensor 70 may be a pair of contact probes 56 in contact with a portion of the wiring of the series battery circuit. As shown in FIG. 5A, B, the battery runaway monitor may be mounted to a metallic element 53 inserted in series with the series wiring of the battery string 15. The metallic element 53 may a bar of copper that is coated, for example with tin. The contact probes may also be copper coated with tin, although other metals and coatings may be used; the ends of the probes disposed to contact the metallic element 53 may have ends configured so as to increase the contact pressure. The function of the bar 53 is to provide a structure to which the battery runaway monitor 50 may be mounted for purposes of sensing current in the circuit that includes the metallic element 53. So long as the resistance of the structure is repeatable over temperature and the mechanical properties permit the mounting of the monitor 50, the details are not of concern.

As shown in FIG. 5B, the monitor 50 is held against the bar 53 by a force F which may be applied between a top surface of the monitor 50 and the bar 53 by a clamp (not shown) of other structure. The clamp and the housing of the monitor combine to force probes 56 against the bar 53. The clamp and housing should therefore have an insulating property with respect to the metallic element 53 and the probes 56.

The resistance of the bar between the two contact points of the probes 56 will result in a voltage drop therebetween when a current flows in the battery string circuit. As is known, the voltage drop may be measured by a voltmeter, and the use of a high-input-impedance device is desirable to minimize the current that must pass through the contact points between the probes 56 and the bar 53. Any voltage drop in the connection between the probe 56 and the bar 53, if it were unequal, would reduce the accuracy of the current measurement. As the resistance of a metal, such as copper has a temperature coefficient, and the temperature of the bar 53 depends on the ambient temperature and the power dissipated in the bar 53 by the current flowing thought the resistivity, the resistance is generally a function of the magnitude of the current being measured. For copper, the temperature coefficient is approximately $0.0039/°$ C. In a precision measuring system, the temperature may need to be closely monitored. However, the present application has a rather less stringent requirement.

When the battery string is in a state where the battery system is providing the full current required by the load, each of the individual battery strings is also providing a proportional share of the current. In this state the maximum discharge current is also being provided. This would cause a rapid increase in temperature of the bar 53. The temperature of the bar is reduced when the system is being recharged as the current is substantially lower. Highly accurate current measurements are not needed during the discharge phase as the remainder of the estimating process provides a self-compensating mechanism. However, temperature sensor may be used to estimate the change in resistance.

Other types of current sensors, such as a Hall-effect sensor, as are known in the art, may be used instead of the contact probe sensor.

Once power is restored, the power supply supplies current to the battery string and the magnitude of the current is typically less than 10 percent of the maximum discharge current, and the charging current slowly decreases as the charging process proceeds until the fully charged or float state is reached. This is the normal scenario shown in FIG. 2. The float state typically results in a current in the string that is about 5 percent or less of the charging current and thus about 0.5 percent of the discharge current.

The current measurement circuit may be a differential amplifier used to amplify the voltage difference appearing between the probes 56. The input may be filtered so as to minimize high frequency noise. Any DC offset voltage at the differential amplifier input may cause an error in the measurement of current, and since the voltage offset of an operational amplifier may vary with temperature and time, a input voltage zeroing circuit may be used. One simple circuit involves interchanging the input leads with a transfer switch so that the offset may be determined. This may be done when a low current is flowing. However, the results may be obtained at any current and the measured offset used for current values in the value range consistent with the measurement. The use of a differential amplifier is a convenient way of rejecting common-mode noise and ripple pick up. Alternatively, simultaneous sampling schemes may be used.

The zero-offset circuit measurement circuit may be realized also by connecting the analog-to-digital converter input to a fixed voltage source, which may be a circuit ground. This may be accomplished through a channel of the multiplexer. In addition to using the zero-offset measurement to set the zero current point, the value of the offset may be compared against known limits so as to determine proper operation of the circuit.

In an aspect, the current measurement circuit may have an open circuit detection capability so that failure of one or both of the probes 56 to make contact with the bar 53 may be detected. A high impedance voltage source is connected to one of the probes 56 and a high impedance connected to the other of the probes 56 so as to provide a current return circuit. When the probes 56 are in contact with the bar, the bar 53 provides a short circuit between the high impedance voltage source and the high impedance return circuit. The very small current flowing in the bar 43 between the probes 56 does not compromise the current measurement accuracy. However, if the bar 53 is not in the circuit, a voltage approximately equal to the high-impedance source voltage will appear across the operational amplifier input terminals and effectively saturate the operational amplifier.

When used in an operating battery backup system, the monitor may be configured to operate without external knowledge of the state of the system. That is, the monitor 50 may be configured to determine the current operating state and perform the analysis of battery condition in an autonomous manner.

Figure 6:
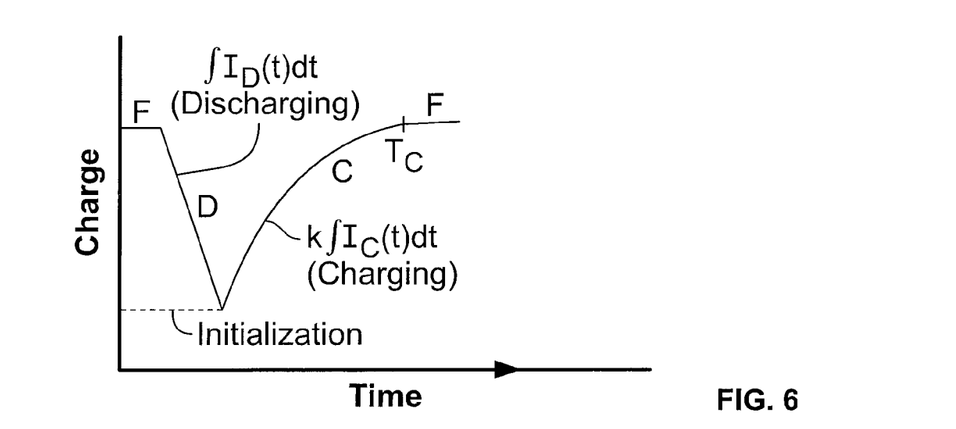
FIG. 6 is a conceptual graph of the state of charge of a battery string as a function of time during a discharge and subsequent charging cycle.

Identification of a discharge event is straightforward. The current at the battery terminals is large and of opposite sign to that measured during a charging period or a float period, as may be seen in the schematic representation of FIG. 2. FIG. 6 is a representation of the charge state of a battery string during a single discharge-charge cycle. Once the charge that was supplied by the battery system has been replenished by recharging, the float state is resumed. Somewhat more charge is needed to recharge the battery than was supplied by the battery, due to systematic inefficiencies. The situation, in practice is more complex, as there may be multiple discharge events or servicing actions of varying durations before the battery system can be fully recharged.

When the runaway monitor 50 is first initialized, the charge state of the battery string to which it is attached is not known to the runaway monitor 50. The battery string 15 may be fully charged, partially charged, or mostly discharged.

One approach to determining the system state on initialization is to assume that the battery string is discharged. The initialization is shown as a dashed line in FIG. 6. The presumed state of the battery remains as discharged until a charging state is encountered, and the charge state value begins to increase until the float state F is reached. If the battery was in a fully charged state, the negative slope of current that would obtain in a discharging event D does not further reduce the charge state as the value had been initialized at a discharged state. When the battery discharge event ends, charging resumes when the prime power is restored, with the value of charge state increasing with time, until a float state F is reached.

The float state F is characterized by a low charging current ("trickle charge") and a high bus voltage. When the float state has been entered, the value of charge state may be adjusted to that of the fully charged state Q of the battery string. Adjusting the charge state value to the fully charged value when the float state F is entered accommodates the situation where the monitor 50 had been initialized when the battery string was, for example, in a partially or fully charged state. At this juncture, the initialization has been completed. Any subsequent discharge event will be measured as a decrement in charge state from the fully charged state value. As there are inaccuracies in the measurement and the estimation of efficiency of the overall process, the limit value that was used for initialization may be selected as a lower limit on the charge state of the battery for the purposes of operation of the monitor.

A state with no current is indeterminate as a link in the battery string may have been opened for safety purposes, or the battery monitor 50 may not be making adequate contact with the bar 53. The current measured by the backup current sensor 90 can identify this situation.

Starting with a condition of minimum battery charge state, the measured current may decrease from a high value at the beginning of the charging cycle to a low value and eventually to a float current value. When the measured current is typical of the float condition, and a high voltage is measured by the voltage sensor, the battery string 15 is connected properly in the battery system and is in a float state.

The accuracy of current measurement may be mitigated by the use of the charge measurement calculation. Provided that the scale constant of the current measurement causes the charge state value to reach a fully discharged state after a full discharge, and the proportionality constant between the current measurement and the battery charge change during a charging event would be adjusted to result in the charge state value returning to close to the fully charged state by the time that the charging current is substantially equal to the float current, and the charge estimation state estimation process would be self-adjusting.

Once in the float state, the float current is not further integrated, as the float current is being used to maintain the fully charged state of the battery string, and the charge state value would remain constant at the fully charged value.

Figures 7A, 7B:
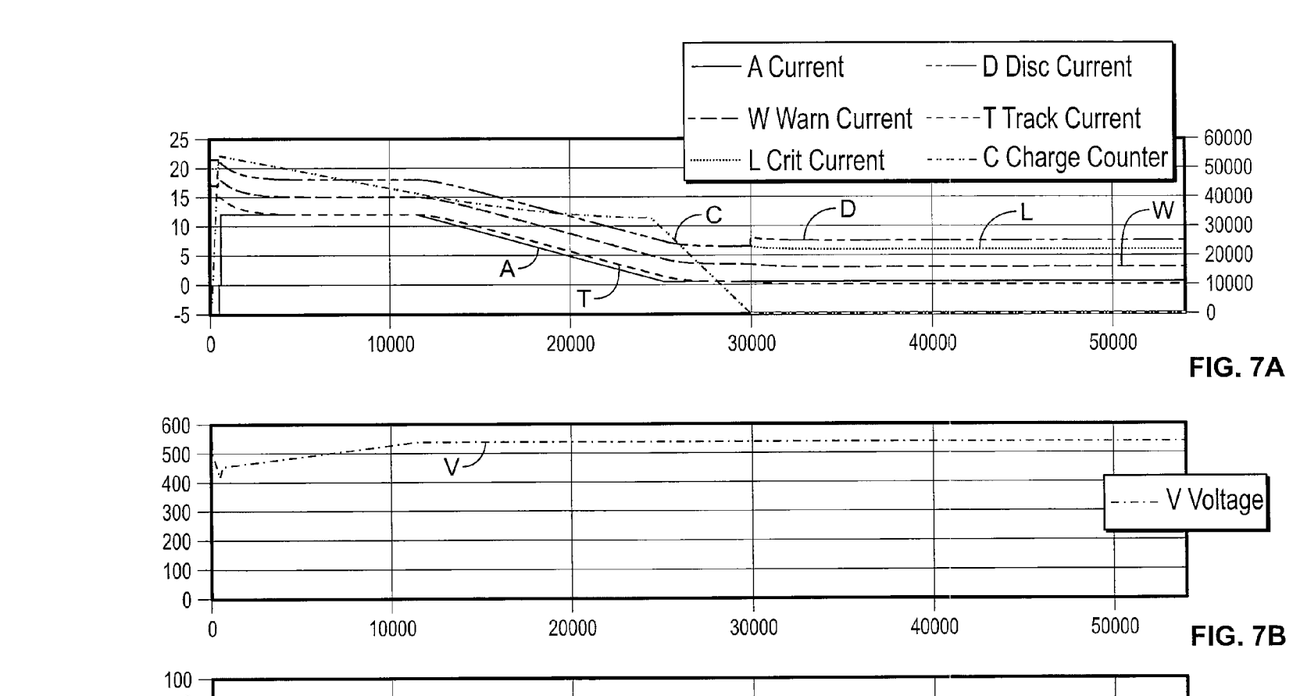
FIG. 7 is a simulation of the measurements of current and voltage of a battery string, and of relevant system protection thresholds during a typical discharge/charge cycle and where: A is a composite graph relating the charging current to various computed parameters; B is a graph of the battery string terminal voltage; and, C is a graph of the current showing the discharge event and subsequent charging cycle.
Figure 7C:
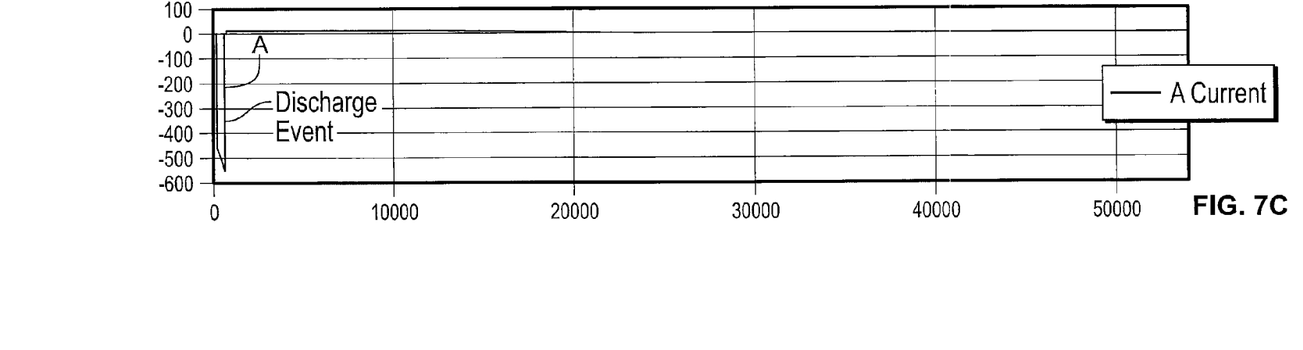

The operation of the runaway monitor 50 may be understood from FIGS. 7 and 8, including the initialization phase. FIG. 7 illustrates a "normal" discharging and charging cycle. The cycle begins with the battery string in a float state (at t=0), but with the charge state not as yet initialized. A discharge event occurs for a period of about 400 seconds with a discharge current of about 500 amperes. Since the scale of the charging current and the discharging current is differs initially by a factor of about 50, the current is shown in FIG. 7C, and the current in FIG. 7A is not shown when it has a negative value (discharging). When the discharge event ends, and the battery is being recharged, the current changes from a large negative value to a small positive value, which is better seen in FIG. 7A. The switch from discharging to charging states occurs when the power supply to the system is restored and the battery is no longer providing the system energy.

FIG. 7B shows the voltage at the terminals of the battery string. When the battery string is in a discharge state, the terminal voltage represents the sum of the terminal voltages of the batteries in the battery string. The internal resistance of the batteries when discharging results in the voltage being lower than the nominal voltage that would obtain in the float state, where the internal current in the battery string is small and the energy is being supplied to the batteries by the battery charger. At the end of the discharge cycle, when the power is restored to the system power supply (battery charger), the voltage rises. The battery charger may limit the current supplied to the battery, by controlling the voltage, so as to prevent an excessive charging rate, and may be allowed to slowly rise as the battery string becomes more fully charged. In this example the voltage rises steadily during the time period 500 seconds to 11350 seconds, at which time the maximum charging voltage is reached, and further charging takes place at lower and lower currents, until a low steady-state current of 0.5 amperes is observed at about 25000 seconds. From this time forward, the battery string is in a float state and is maintained in a fully charged state by the battery charger.

We show the state of charge as a counter value with an inverted scale in FIG. 7A so as to be able to present the curve along with the other curves for comparison purposes. Here, at t=0, the counter is set to zero when the battery is in a float state. When the discharge occurs (t=90-500 seconds), the value of the counter increases substantially linearly, representing the depletion of the charge during the discharge even, reaching a maximum value of about 22.5 (arbitrary units) at the end of the discharge event. When recharging then starts, and the end of the discharge event, the charging current is approximately constant at 12 amperes, and the charge counter is decremented at a constant rate proportional to the estimated charge state improvement. At about 11500 seconds the slope of the charge counter decrement decreases, corresponding to the decrease in charging current that may be seen. This corresponds to the time when the charging process is transitioning from the constant current (variable voltage) to the constant voltage (variable current) states.

When the float state is reached, at about 25000 seconds, the state of the charge counter is about 14 (arbitrary units). But, in this example a fully charged state would have been represented by a value of zero. So, once the float state is reaches, the counter may be decremented more rapidly to correspond to the float state value. This discrepancy arises as the initial choice of the constant of proportionality between the charging current and the charge counter decrement was not a good estimate. This may arise from a poor estimate of the constant of proportionality between the discharge current and the charge counter increment, errors in the constants of proportionality in measuring the charge or discharge current, or the like.

Adjusting the constant of proportionality such that the charge counter reaches zero at approximately the time that the battery string reaches a float state may correct the misestimates. Adjustment of the constant of proportionality may be on the basis of a single discharge/charge cycle, but may be stabilized, for example, by making the adjustments on the basis of an exponential trailing average of the estimates of a plurality of charge cycles.

A battery string is not likely to be in a fully discharged state, as this is detrimental to the lifetime of the battery. However, even though battery systems may be fully assembled at the time of system manufacture. The system may be shipped in a fully charged state, some incidental leakage discharging may occur. The assumption of a fully charged state may therefore be erroneous. However, providing a maximum limit value of the charge counter is set so as to correspond to the presumed fully discharged state, the initialization of the runaway monitor will occur if the device is placed in service with a battery string in a partially discharged state.

Thus, the system may determine that the system is either in a charging state, a discharging state, or in a fully charged state (float state) based on whether the charge counter is incrementing rapidly, decrementing slowly, or nominally zero, respectively. This facilitates establishing threshold limits on the currents that may flow, and the time durations for such flows when the battery string is operating in a safe condition, and to establish the threshold currents for normal operation, for warning currents, critical currents (if needed) and for disconnect current limits. These thresholds may be used to identify thermal runaway conditions; and to activate both alarms and protective measures. A smoothed version of the charging current (termed "tracking current" in FIGS. 7 and 8) may be used to represent the battery string current so as to avoid measurement noise or transient events. The tracking current is shown as being smoothed with an exponential time constant (equivalent to low pass filtering). The slope of the tracking current is always be zero or negative during the charging period, as the charging current in the normal state decreases monotonically with time. Only in the case of a potential thermal runaway condition does the actual charging current increase. During the fully charged (float) state, the charging current is small and essentially constant.

Figure 8A:
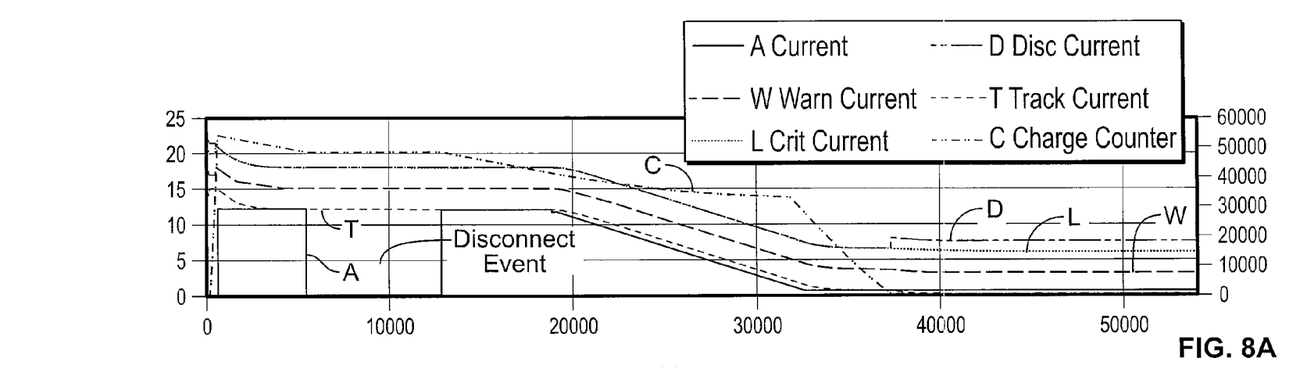
FIG. 8 is a simulation of the measurements of current and voltage of a battery string, and of relevant system protection thresholds during a discharge/charge cycle where the battery string is temporarily disconnected from the system bus during the charging cycle and where: A is a composite graph relating the charging current to various computed parameters; B is a graph of the battery string terminal voltage; and, C is a graph of the current showing the discharge event and subsequent charging cycle.
Figure 8B:
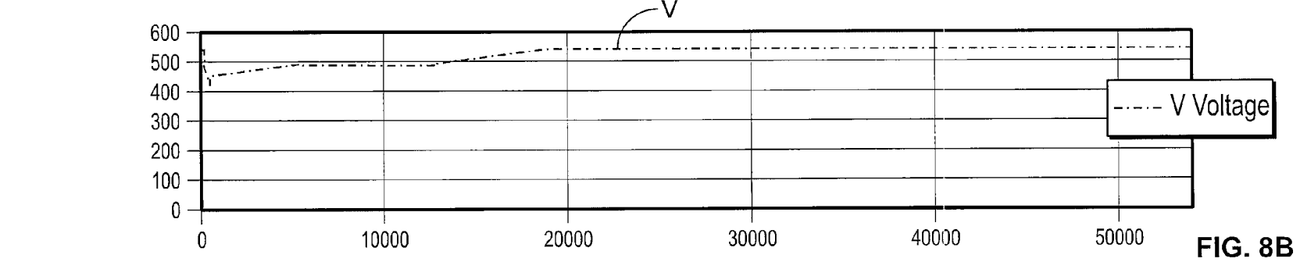
Figure 8C:
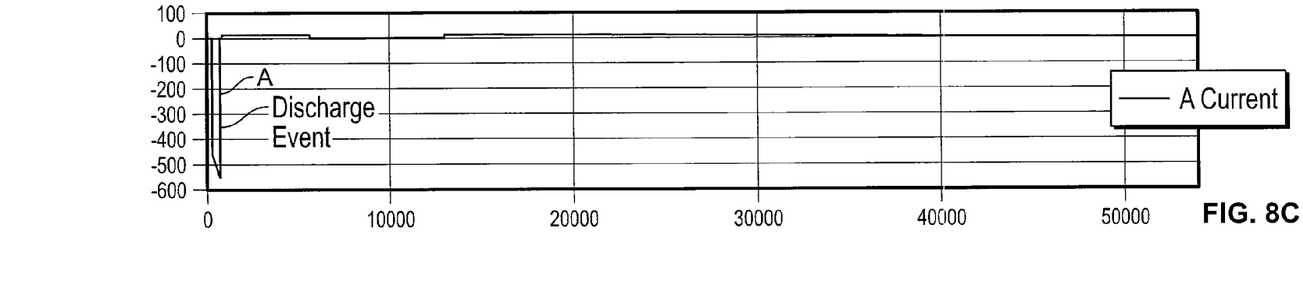

In another aspect, shown in FIG. 8, there may be periods where the battery backup system is disconnected from the load which it is intended to service. This may occur during installation or servicing of the battery system and is characterized by a zero discharge current while a voltage nominally equal to the no-load battery string voltage is measured. The same initial sequence occurs in FIG. 8 as in FIG. 7 for the first 5440 seconds, at which time the battery string is disconnected from the load bus, which is also the charging bus for the battery string (see FIG. 1). The charging current becomes zero, and the charge counter stops decrementing, as it is representative of the charging current. However, the tracking current value is also frozen as the intent of the tracking current is to represent the current when current flowing into the battery: When the battery string current is zero and the voltage is the open circuit battery string voltage, the system is not in any of the states of charging, discharging, or fully charged (float).

After some period of time, the battery string is reconnected to the load bus (t=12860 seconds) and the charging cycle resumes. As the state of battery charge (as represented by the charge counter) does not change in a meaningful manner over a short period of non-operation of the battery string, both the charge counter and the voltage tracking values are appropriate for the continuation of the charging cycle. The overall time to reach the fully charged state in this example has increased by the time that the battery system was disconnected from the system bus.

Criteria for protecting the battery string against thermal runaway may be established on the basis of current thresholds and time of exceeding each threshold value, and be made dependent on the state of charge of the battery. In FIG. 7A, the warning current and the disconnect current during the charging period may be set at an incremental increase in current value with respect to the tracking current, and the actual current compared against the thresholds. A disconnect time and a warning time may be set. The disconnect time is greater than the warning time. When the charge counter in FIG. 7A reaches zero (t=30000) seconds, and the float state is entered, a different set of criteria may be set, as may be seen by the increase in the threshold current value for the disconnect current (with respect to the float current) and the increase in time to disconnect. Additional thresholds may be introduced so as to alert the system operator such as a critical current. This is reasonable as the currents are lower and the pace of thermal runaway would be slower. The battery is cooler in the float state.

Alarms may be provided locally by light or sounds, and may be reported over a communications medium, which may be a local area network (LAN), the Internet, or the like, to a local or remote monitoring station.

A method of protecting a battery against thermal runaway may include: measuring the current and voltage at the terminals of a battery or at the ends of a battery string; determining the state of charge of the battery by maintaining a charge counter, whose value is proportional to the signed value of the current flow and the voltage value; establishing current protection thresholds that are related to the expected values of the current and the duration of the time where the actual current exceeds the current threshold during the determined state; providing an alarm when a current exceeds the a first set of predetermined protection values, and providing an actuation control for disconnecting the battery string from the load when the current exceeds a second set of predetermined protection values.

A method of measuring the current of a battery string may include: providing an insulating plate; positioning a pair of conductive probes spaced apart along a length of the insulating plate; providing a high impedance voltage measurement circuit connected between the pair of conductive probes; the method further including: mounting the insulated plate to an electrical bus so as to force the pair of conductive probes against the surface of the electrical bus, with the pair of probes oriented such that a line drawn between them is substantially parallel to a direction of current flow in the bus; the conductive probes having ends in contact with the bus having a shape, and being urged against the bus by the mounting so as to form an electrical contact having a resistance substantially less than the impedance of the voltage measurement circuit.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

It is therefore intended that the foregoing detailed description be regarded as illustrative rather than limiting, and that it be understood that it is the following claims, including all equivalents, that are intended to define the spirit and scope of this invention.

What is claimed is:

1. A storage battery system runaway protection unit, comprising:
   a current sensor;
   a voltage sensor connected across a series string of storage batteries;
   a processor configured to accept data from the current sensor and the voltage sensor and to:
      determine a charging state of the series string of storage batteries;
      compute a measure of the state of charge of the series string of storage batteries;
      compare a measured current of the current sensor with a state dependent threshold current;
      set a threshold current and a delay time criteria for each of a fully charged state and a charging state, wherein a threshold in the charging state is related to an averaged battery string current value for the charging state; and
      provide a warning or control signal output when the measured current exceeds the threshold current for a predetermined delay time.

2. The unit of claim 1, wherein the current sensor further comprises: a pair of conductive probes urged into contact with a metallic element connected in series with a series string of batteries, the probes oriented substantially along a direction of current flow in the metallic element.

3. The unit of claim 2, wherein the metallic element is a bus bar.

4. The unit of claim 1, wherein the current sensor is a Hall effect current sensor.

5. The unit of claim 1, wherein the charging state is one of: discharging, charging or float charging.

6. The unit of claim 5, wherein the charging state comprises a plurality of sub states, including normal charging and disconnected from a load.

7. The unit of claim 1, where the state of charge of the battery is a measure of an amount of energy in the battery and decreases during discharge events and is constant or increases during charging events.

8. The unit of claim 7, wherein the state of charge of the battery is a maximum during a float charging state.

9. The unit of claim 1, wherein the state of charge is computed by multiplying the current by a first constant during a discharging state and by a second constant during the charging state.

10. The unit of claim 1, wherein the computed state of charge is adjusted to be a maximum value when the charging state is a float charging state.

11. The unit of claim 9, wherein the adjustment is to increase the absolute value of the second constant and to continue to compute the state of charge until the maximum value is reached.

12. The unit of claim 11, wherein the second constant is adjusted after each charging cycle to provide an estimate of the state of charge that is closer to the maximum value when a floating charging state is reached.

13. The unit of claim 1, wherein a tracking current value is computed as low pass filtered version of the battery string current during the charging state, except that the value is maintained at the value that obtains during a period where the string current is zero and a string voltage is substantially an operating voltage.

14. The unit of claim 13, wherein the measured current in each of the charging and discharging states is compared with a threshold value corresponding to the charging state.

15. The unit of claim 14, wherein the threshold value is at least one of a value proportional to the tracking current, a predetermined increase of the tracking current, or a fixed current value.

16. The unit of claim 15, wherein a delay time is associated with each threshold value.

17. The unit of claim 16, wherein an alarm type or control signal type is associated with combinations of threshold values, delay times and charging states and wherein the alarm or control signal is output when an associated combination of threshold value and delay time is exceeded.

18. The unit of claim 1, wherein the control signal activates a disconnect switch to isolate the battery string from a system current bus.

19. The unit of claim 1, wherein the current sensor includes voltage source having a high impedance with respect to a resistance of a metallic element circuit between a pair of probes, the voltage source connected to one probe of the pair of probes.

20. The unit of claim 1, where an offset voltage between input terminals of an amplifier is measured by one of connecting two input terminals to a common point, by measuring a fixed voltage, or by interchanging the connections between a pair of probes and the input terminals.

21. The unit of claim 1, further comprising a temperatures sensor in thermal contact with a metallic element, providing a temperature measurement to the processor, wherein the processor adjusts a value of measured current based on an estimate of a resistance of the metallic element as a function of temperature.

22. A method of protecting a storage battery system from thermal runaway, comprising:
   measuring a current of a storage battery string
   measuring a voltage of the storage battery string;
   determining a charging state of battery string as one of charging, discharging or fully charged;
   determining the state of charge of the storage battery string;
   determining threshold current and delay time criteria for each of a fully charged state and a charging state, wherein a threshold in the charging state is related to an averaged battery string current value for the charging state; and
   providing an alarm or control signal when the threshold in the charging state or in the fully charged state is exceeded by the measured current for greater than the delay time criteria for the threshold.

23. The method of claim 22, wherein a plurality of thresholds and delay time criteria is established in each of the charging states of charging and fully charged, and a specific alarm or control signal is associated with a determination that a threshold and delay time has been exceeded.

24. The method of claim 22, wherein, when the charging state is charging, and the current is zero while the voltage is substantially the battery string voltage, the charging state is maintained as charging until the current is non-zero, and the state of charge.

25. The method of claim 22, wherein the average current value is determined as a low-pass filtered value of the current in the charging state, excluding any interruptions in a charging process.

26. The method of claim 22 wherein the state of charge of the battery string is determined by a counter that is decremented at a first rate during a discharging state having a first constant of proportionality to the battery string current and incremented at a second rate during a charging period having a second constant of proportionality to the battery string current, except that the counter is not incremented when the battery string current is zero and the voltage is substantially the battery string voltage.

27. The method of claim 26, wherein the second constant of proportionality is adjusted to minimize a time difference between the counter reaching a fully charged value and the time when the average battery string current indicates that the battery string is fully charged.

28. The method of claim 22, wherein at least one threshold value in the charging state is proportional to the averaged battery string current.

29. The method of claim 22, wherein at least one threshold in the charging state is a sum of a constant and an averaged measured current.

30. The method of claim 22, wherein at least one threshold value in the fully charged state is a constant current value.

31. A software program product, stored on a non-transitory medium, comprising: instructions executable by a processor to perform the steps of:

measuring a current of a battery string measuring a voltage of the battery string;

determining the charging state of battery string as one of charging, discharging or fully charged;

determining a state of charge of the battery string;

determining threshold current and delay time criteria for each of a fully charged state and a charging state, wherein a threshold in the charging state is related to an averaged battery string current value for the charging state; and providing an alarm or control signal when the threshold in a charging state or in a fully charged state is exceeded by the measured current for greater than the delay time criteria for the threshold.

* * * * *

UNITED STATES PATENT AND TRADEMARK OFFICE
CERTIFICATE OF CORRECTION

Page 1 of 1

PATENT NO. : 9,577,443 B2
APPLICATION NO. : 13/775753
DATED : February 21, 2017
INVENTOR(S) : Eric Gach et al.

It is certified that error appears in the above-identified patent and that said Letters Patent is hereby corrected as shown below:

On the Title Page

Left column, insert item (63) as follows:
-- (63) Related U.S. Application Data
This application is a continuation-in-part of US 12/793,025 filed on June 3, 2010, now patent No. 8,558,718, which is related to US application No. 12/117,462, filed on May 8, 2008. --.

Signed and Sealed this
Twenty-fourth Day of April, 2018

Andrei Iancu
*Director of the United States Patent and Trademark Office*